(12) United States Patent
Chen et al.

(10) Patent No.: US 6,794,203 B2
(45) Date of Patent: Sep. 21, 2004

(54) METHOD OF CALCULATING THE REAL ADDED DEFECT COUNTS

(75) Inventors: Wei-Ming Chen, HsinChu (TW);
Kun-Yu Liu, HsinChu (TW);
Chun-Chieh Chen, HsinChu (TW);
Lien-Che Ho, HsinChu (TW)

(73) Assignee: Macronix International Co., Ltd., Hsinchu (TW)

( * ) Notice: Subject to any disclaimer, the term of this patent is extended or adjusted under 35 U.S.C. 154(b) by 130 days.

(21) Appl. No.: 10/218,591

(22) Filed: Aug. 15, 2002

(65) Prior Publication Data

US 2004/0033632 A1 Feb. 19, 2004

(51) Int. Cl.⁷ .............................................. H01L 21/66
(52) U.S. Cl. ........................................ 438/14; 438/15
(58) Field of Search ..................................... 438/14, 15

(56) References Cited

U.S. PATENT DOCUMENTS 5,355,212 A * 10/1994 Wells et al. ............. 356/237.4
5,464,779 A * 11/1995 Fujimaki ..................... 438/16
6,060,329 A * 5/2000 Kamata et al. ................ 438/9
6,449,035 B1 * 9/2002 Batchelder ............... 356/237.1

* cited by examiner

Primary Examiner—John Niebling
Assistant Examiner—Olivia T. Luk
(74) Attorney, Agent, or Firm—Rabin & Berdo, P.C.

(57) ABSTRACT

The present invention provides a method of producing an added defect count for monitoring the property of chambers or wafers. First, a proper pre-process sensitivity is determined with map to map process by maximizing the summation of a mapping rate and a catching rate. Second, a wafer is scanned with the proper pre-process sensitivity and a pre-process particle number P1 is recorded. Third, a manufacturing step is processed on the wafer. Fourth, the wafer is scanned with the most sensitive scale of the post-process sensitivities and a post-process particle number P2 is recorded. Finally, the post-process particle number P2 is subtracted from the pre-process particle number P1.

7 Claims, 3 Drawing Sheets

| Various pre-dep sensitivity (um) | D₁, the number of pre-dep particle data D₁(x,y) | D₂, the number of post-dep particle data D₂(x,y) | D₃, the number of common particle data D₃(x,y) | Mapping rate (D₃/D₁) | Catching rate (D₃/D₃max) | SUM of mapping rate and catching rate |
|---|---|---|---|---|---|---|
| 0.2 | 40 | 30 | 23 | 0.575 | 1 | 1.575 |
| 0.235 | 19 | 30 | 18 | 0.947368 | 0.782609 | 1.729977 |
| 0.27 | 16 | 30 | 16 | 1 | 0.695652 | 1.695652 |
| 0.3 | 14 | 30 | 14 | 1 | 0.608696 | 1.608696 |
| 0.4 | 11 | 30 | 11 | 1 | 0.478261 | 1.478261 |
| 0.5 | 11 | 30 | 11 | 1 | 0.478261 | 1.478261 |
| 1 | 11 | 30 | 11 | 1 | 0.478261 | 1.478261 |

D3max, the maximum number of common particle number D3, is 23.

FIG. 3

METHOD OF CALCULATING THE REAL ADDED DEFECT COUNTS

BACKGROUND OF THE INVENTION

1. Field of the Invention

The invention relates in general to a method of producing an added defect count, and more particularly to a method of producing an added defect count by a map to map process.

2. Description of the Related Art

In generally, added defect count is used as an index to monitor the chamber condition of semiconductor apparatus. Only as the defect count is smaller than a certain number, the semiconductor manufacturing is allowed to be processed in the chamber. The defect count also plays as an indication of wafer quality for each manufacturing step, especially for the film deposition step.

Please refer FIG. 1, it shows a flow chart of producing an added defect count for a certain film deposition step according to a traditional method. In step 101, a wafer is scanned before the certain film step is processed and a total particle count P1 is recorded. In step 102, the certain film deposition step, such as depositing a silicon oxide layer, a nitride layer or a metal layer, is manufactured on the wafer. In step 103, the wafer is scanned again after the certain film deposition step is processed and a total particle count P2 is recorded. Finally, in step 104, the added particle is evaluated by subtracting P2 from P1.

However, that some particles appear before the deposition of certain film and disappear after the formation of the certain film usually makes the added defect count as a negative value. Therefore, the added defect count produced from the traditional method not only reflects no real condition of the manufacturing chamber, but also disturbs engineer's judge.

In the present invention, a method to solve this problem will be disclosed.

SUMMARY OF THE INVENTION

The object of the present invention is to provide an added particles to reflect the quality of the wafers or the chambers with more consulting value.

First, a proper pre-dep sensitivity is determined by evaluating common particles and by maximizing the summation of the mapping rate and catching rate. Then, the proper pre-dep sensitivity is applied to the mass-production wafers.

For the process of deciding the proper pre-dep sensitivity, at first, a wafer is scanned with various pre-dep sensitivities, and the pre-dep particle data D1(x,y) is recorded. Second, a film is deposited on the wafer and the wafer is scanned again to record the post-dep particle data D2(x,y) only with a post-dep sensitivity, which is usually the most sensitive scale. Third, the common particle data D3(x,y) is evaluated by comparing the pre-dep particle data D1(x,y) and the post-dep particle data D2(x,y) within an error, ranging from 50 μm to 100 μm. Finally, the proper pre-dep sensitivity is decided by maximizing the summation of a mapping rate and a catching rate, wherein the mapping rate is defined as the ratio of the common particle number D3 to the pre-dep particle number D1, and the catching rate is defined as the ratio of the common particle number D3 to the maximum common particle number $D3_{max}$.

For the application of the proper pre-dep sensitivity to the mass-production wafers, at first, the mass-production wafers is scanned with the proper pre-dep sensitivity, and the pre-dep particle count P1 is recorded. Second, film deposition, which is same as mentioned before, is processed on the mass-production wafers. Third, the mass-production wafers are scanned again with the most sensitive-scale of the post-dep sensitivities, and the post-dep particle count P2 is recorded. Finally, added particles are calculated by subtracting the post-dep particle count P2 from the pre-dep particle cpunt P1.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 3 shows a table created according to the step 201 through step 205 in FIG. 2.

DETAILED DESCRIPTION OF THE INVENTION

In the following description, for purposes of explanation, specific numbers, materials and configurations are set forth in order to provide a thorough understanding of the present invention. However, it will be apparent to one skilled in the art that the present invention may be practiced without the specific details. Well-known features are omitted or simplified in order not to obscure the present invention.

Figure 1:
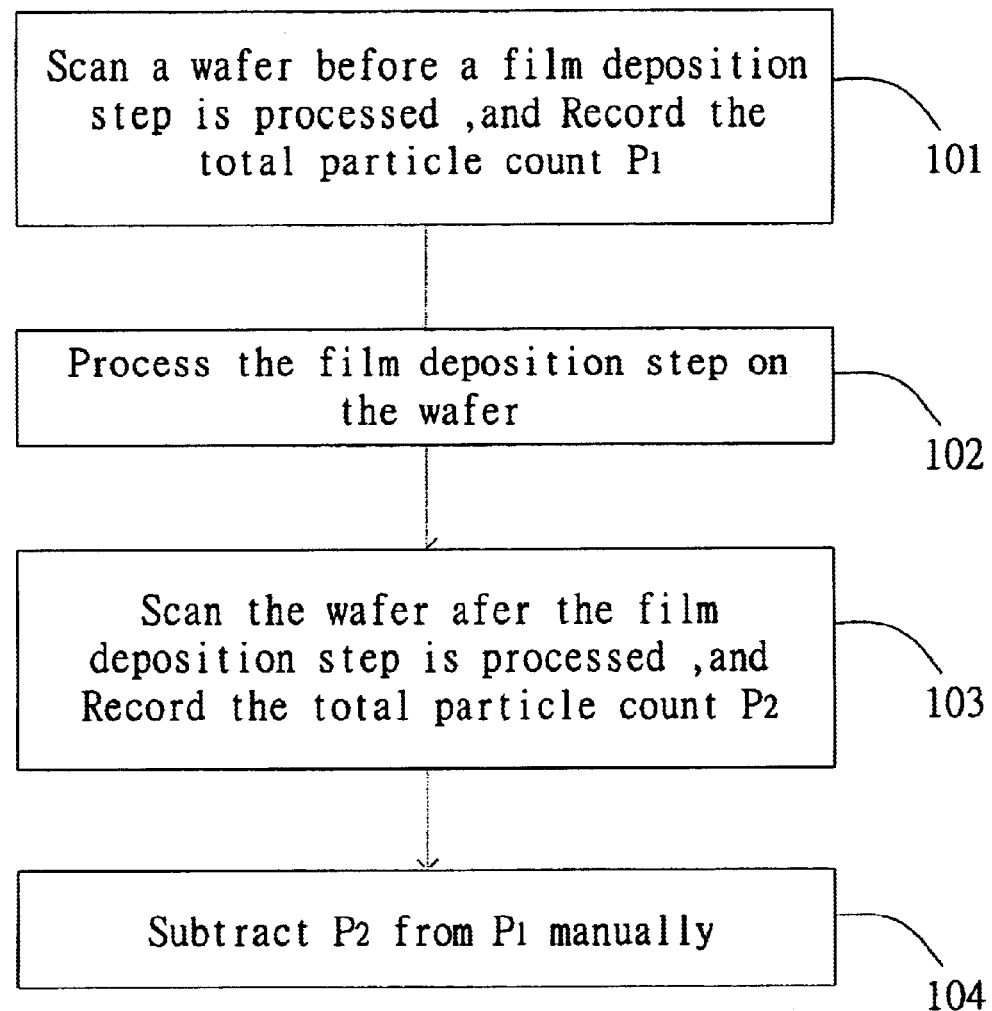
FIG. 1 shows a flow chart of producing an added-particle for a certain film deposition step according to a traditional method.
Figure 2:
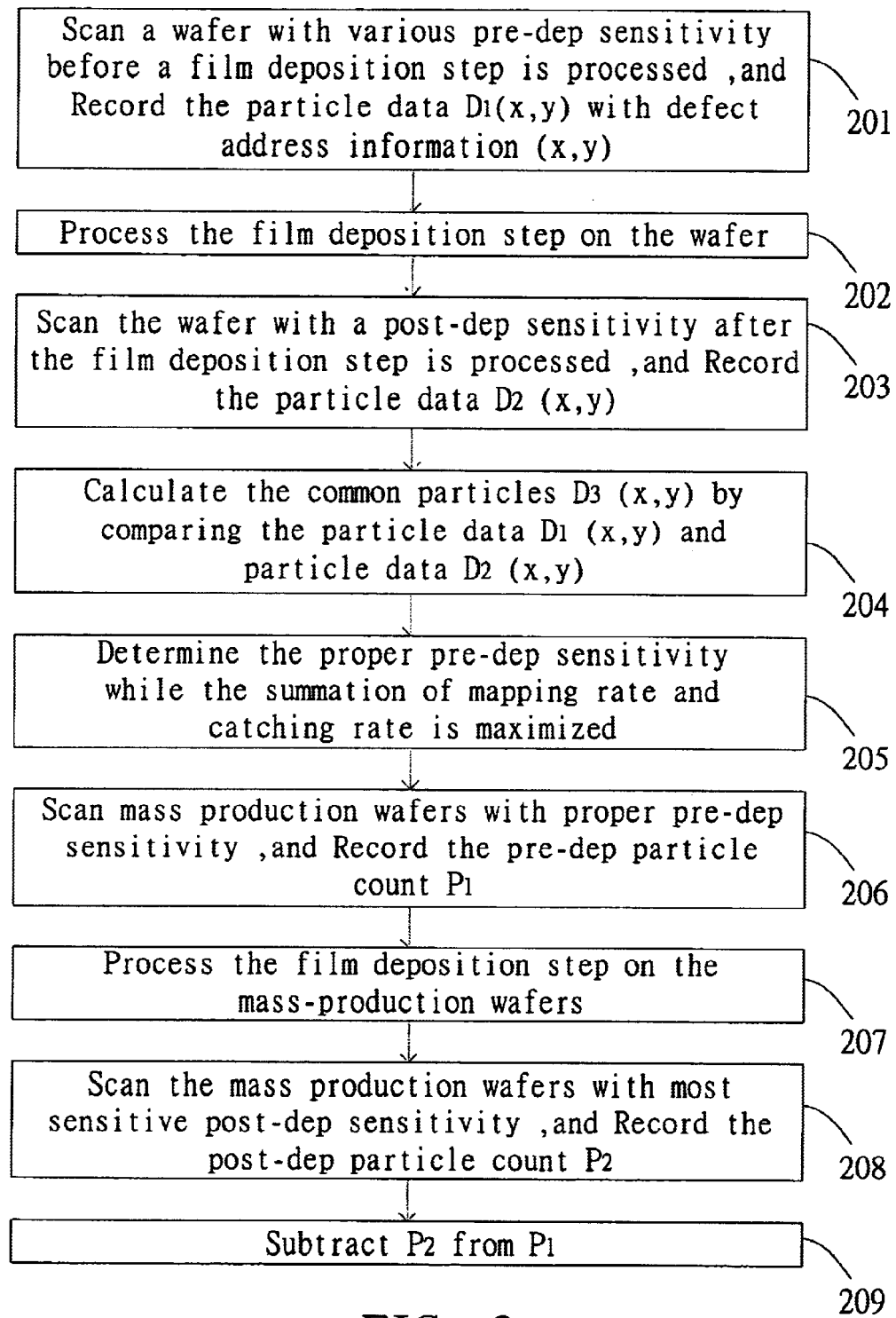
FIG. 2 shows a flow chart of producing an added-particle for a film deposition according to the method of the present invention.

Referring to FIG. 2, it shows a flow chart of producing an added-particle for a film deposition according to the method of the present invention. The embodiment of the present invention is not limited to the film deposition process. Any manufacturing step is applicable in the present invention as only as the added-particle is requested as a monitor data.

From step 201 to step 205, a proper pre-dep sensitivity is determined by evaluating common particles and by maximizing the summation of the mapping rate and catching rate. Then, from step 206 through step 209, the proper pre-dep sensitivity is applied to the manufacturing of mass production.

In step 201, a wafer is scanned with various pre-dep sensitivities, ranging from 0.2 μm to 1 μm. However, the pre-dep sensitivities are depended on the property of the wafers or the work on the wafers, and they can be larger than 1 μm or smaller than 0.2 μm. The pre-dep particle data D1(x,y) is recorded with address information (x,y) for the following tracing. In step 202, a film, such as a polysilicon layer, an oxide layer, or a nitride layer, is deposited on the wafer. In step 203, the wafer is scanned again with a post-dep sensitivity, which is usually the most sensitive scale of the post-dep sensitivities. And the post-dep particle data D2(x,y) is recorded. Therefore, each pre-dep sensitivity corresponds to a pre-dep particle data D1(x,y) and a post dep particle data D2(x,y).

In step 204, the common particle data D3(x,y) is evaluated by comparing the pre-dep particle data D1(x,y) to the post-dep particle data D2(x,y) within an error. As one certain particle of the pre-dep particle data D1(x,y) has the same position with the other particle of the post-dep particle data D2(x,y), they are regarded as the same particle and classified as one of the common particles. And its position is also recorded as one of the common particle data D3(x,y). The process to evaluate the common particles is also named as "map to map method". The error of the "map to map" method ranges from 50 μm to 100 μm, while the pre-dep particle data D1(x,y) is compared with post-dep particle data D2(x,y).

In step 205, a proper pre-dep sensitivity is decided by maximizing the sum of a mapping rate and a catching rate. A pre-dep particle number D1 and a post-dep particle number D2 are respectively the particle number of the pre-dep particle data D1(x,y), the post-dep particle data D2(x,y). A common particle number D3 and a maximum common particle number $D3_{max}$ are the particle number of common particle data D3(x,y) at various pre-dep sensitivities and the maximum number of the common particle number D3, respectively. The mapping rate is defined as the ratio of the common particle number D3 to the pre-dep particle number D1. The catching rate is defined as the ratio of the common particle number D3 to the maximum common particle number $D3_{max}$. As the sum of the mapping rate and catching rate reached its maximum, the corresponding pre-dep sensitivity is regarded as the proper pre-dep sensitivity, which is applied in the following steps of step 206 to step 209.

Referring to FIG. 3, it shows a table created by the step 201 through step 205. In this embodiment, the pre-dep sensitivities range from 0.2 μm to 100 μm, which is shown in the first column. The second column and the third column are the pre-dep particle number D1 and post-dep particle number D2, respectively. The fourth column is the common particle number D3, wherein the maximum number of 23 is the common particle number $D3_{max}$.

In FIG. 3, the mapping rate in the fifth column is evaluated according to the relation, which the common particle number D3 is divided by the pre-dep particle number D1. The catching rate in the sixth column is the ratio of common particle number D3 to the maximum common particle number $D3_{max}$. The last column in FIG. 3 is the sum of the mapping rate and the catching rate, among which the maximum value is 1.729977. The pre-dep sensitivity, corresponding to the maximum value in the last column, 0.235 μm, which is the proper pre-dep sensitivity mentioned before.

Referring to FIG. 2, from step 206 through step 209, the proper pre-dep sensitivity is applied to the manufacturing of mass production. In step 206, the mass-production wafer is scanned with the proper pre-dep sensitivity, and the pre-dep particle count P1 is recorded.

In step 207, film deposition, which is same with that in step 202, is processed on the wafer of mass production. Then, in step 208, the mass-production wafers are scanned again with a post-dep sensitivity, which is the same sensitive scale used in step 203. The post-dep particle count P2 in step 208 is recorded, too. Finally, in step 209, the added-particle is calculated by subtracting the post-dep particle count P2 from the pre-dep particle count P1.

As mentioned before, any manufacturing step, which is monitored by the added particle, is applicable in the present invention. According to the method of the present invention, each manufacturing step will correspond to a proper pre-dep sensitivity, which is taught in step 201 to step 205.

For the ideal case, all wafers of mass production are processed by the "map to map" process, however, which will cost much time and consume labors' working. Moreover, the traditional method is too rough to reflect the real condition. The present invention discloses a method to monitor the wafer quality or chamber quality more correctly, compared with the traditional method, and spends less cost than the ideal case. The method of the present invention will not provide the operators or engineers a disturbing indication by choosing a proper pre-dep sensitivity at first. Then, the proper pre-dep sensitivity is applied to the mass production.

It is understood that the form of the invention shown and described in the detailed description and the drawings are to be taken merely as presently preferred examples. All the variations of the preferred embodiments disclosed, including the evaluation of common particles and the determination of a proper pre-dep sensitivity, are within the scope of the invention.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of selecting a sensitivity to count particles in a pre-process, by which a counting of added particles during the process will be more correct, the method comprising the steps of:

counting particles in a pre-process in respect of a plurality of sensitivities;

counting particles in a post-process under a certain sensitivity;

finding the count of corresponding particles appearing in both of the pre-process and the post-process in respect of respective sensitivities;

calculating respective mapping rates and respective catching rates of respective sensitivities, the mapping rate resulting from dividing the count of corresponding particles in respect of one sensitivity by the count of particles in the preprocess of such one sensitivity, and the catching rate resulting from dividing the count of corresponding particles in respect of one sensitivity by the maximum count of corresponding particles under a comparison in respect of all sensitivities;

selecting a sensitivity having a maximum summation of the mapping rate and the catching rate with respect to a same sensitivity.

2. The method according to claim 1, wherein the position difference, being between said pre-process and said post-process, of said corresponding particles is in the range from 50 μm to 100 μm.

3. The method according to claim 1, wherein the said certain sensitivity is the most sensitive scale of post-process.

4. A method of counting added particles during a semi-conductor manufacturing process on a work, in which a count of particles after said process, in post-process, on the work is subtracted by a count of particles before said process, in pre-process, on the work, being characterized in that:

the count of particles in preprocess is detected under a sensitivity that is selected based upon a mapping rate and a catching rate of the sensitivity, the mapping rate resulting from dividing the count of corresponding particles appearing in both of pre-process and pro-process by the count of particles in the pre-process in respect of a certain sensitivity, and the 50 μm to 100 μm from dividing said count of corresponding particles by the maximum count of corresponding particles in post-process under a comparison in respect of all sensitivities.

5. The method according to claim 4, wherein the position difference, being between said pre-process and said post-process, of said corresponding particles is in the range from 50 μm to 100 μm.

6. The method according to claim 4, wherein the said certain sensitivity is the most sensitive scale of said all sensitivities.

7. The method according to claim 4, wherein the said semiconductor manufacturing process is each manufacturing step, especially for the film deposition process.

* * * * *